(12) United States Patent
Law et al.

(10) Patent No.: US 12,317,759 B2
(45) Date of Patent: May 27, 2025

(54) CREATING MAJORANA ZERO MODES IN QUANTUM ANOMALOUS HALL INSULATOR/SUPERCONDUCTOR HETEROSTRUCTURES

(71) Applicant: The Hong Kong University of Science and Technology, Kowloon (HK)

(72) Inventors: Kam Tuen Law, Kowloon (HK); Yingming Xie, Sai Kung (HK); Xuejian Gao, Sai Kung (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 651 days.

(21) Appl. No.: 17/672,434

(22) Filed: Feb. 15, 2022

(65) Prior Publication Data
US 2022/0262856 A1   Aug. 18, 2022

Related U.S. Application Data

(60) Provisional application No. 63/149,666, filed on Feb. 16, 2021.

(51) Int. Cl.
*H10N 69/00*    (2023.01)
*G06N 10/40*    (2022.01)
*H10N 60/00*    (2023.01)

(52) U.S. Cl.
CPC ............. *H10N 69/00* (2023.02); *G06N 10/40* (2022.01); *H10N 60/00* (2023.02)

(58) Field of Classification Search
CPC .......... H10N 69/00; H10N 60/00; G06N 10/40
See application file for complete search history.

(56) References Cited

U.S. PATENT DOCUMENTS 3,826,001 A * 7/1974 Bilbrey ................ H02G 1/1226
                                              30/142
9,040,959 B2   5/2015 Lutchyn et al.
(Continued)

OTHER PUBLICATIONS

Haiping Hu, "Chiral and counter-propagating Majorana fermions in a p-wave Superconductor", New J. Phys. 21, 123014 (Year: 2019).*
(Continued)

*Primary Examiner* — S M Sohel Imtiaz
(74) *Attorney, Agent, or Firm* — Amin, Turocy & Watson, LLP

(57) ABSTRACT

The technologies described herein are generally directed to generating, detecting, and manipulating Majorana zero-energy modes which can be utilized to achieve the topological quantum computation, in accordance with one or more embodiments. One or more embodiments described include a platform based on a quantum anomalous Hall insulator/superconductor heterostructure. Specifically, the method can include making a cut in the quantum anomalous Hall insulator material to form a topologically protected helical channel with counter-propagating electron modes. When superconductivity is induced on the helical channel, Majorana zero-energy modes are formed. Furthermore, controllable gates and quantum dots can be integrated to the system such that the braiding of Majorana zero-energy modes can be achieved. This method provides a potential realization of the scalable fault-tolerant quantum computation.

20 Claims, 8 Drawing Sheets

(56) References Cited

U.S. PATENT DOCUMENTS

| | | | |
|---|---|---|---|
| 10,020,438 B2 | 7/2018 | Yazdani et al. | |
| 10,665,701 B2 | 5/2020 | Freedman et al. | |
| 10,879,464 B2 | 12/2020 | Krogstrup Jeppesen et al. | |
| 2013/0299783 A1* | 11/2013 | Lutchyn | H10N 60/128 257/31 |
| 2017/0207294 A1* | 7/2017 | Gilbert | H01L 28/10 |
| 2017/0293854 A1* | 10/2017 | Freedman | B82Y 10/00 |
| 2019/0027672 A1* | 1/2019 | Megrant | H10N 60/80 |
| 2020/0287120 A1* | 9/2020 | Pikulin | H01L 21/28132 |
| 2020/0356887 A1* | 11/2020 | Moodera | H10N 69/00 |
| 2021/0399200 A1* | 12/2021 | Schueffelgen | H10N 60/0912 |
| 2022/0020914 A1* | 1/2022 | Shabani | H10N 60/01 |

OTHER PUBLICATIONS

M. Kayyalha, D. Xiao, R. Zhang, J. Shin, J. Jiang, F. Wang, Y.-F. Zhao, R. Xiao, L. Zhang, K. M. Fijalkowski, P. Mandal, M. Winnerlein, C. Gould, Q. Li, L. W. Molenkamp, M. H. W. Chan, N. Samarth, and C.-Z. Chang, "Absence of evidence for chiral Majorana modes in quantum anomalous Hall-superconductor devices" Science 367, 64 (2020). 5 pages.

A. C. Potter and P. A. Lee, "Multichannel Generalization of Kitaev's Majorana End States and a Practical Route to Realize Them in Thin Films" arXiv:1007.4569v3 [cond-mat.supr-con] Nov. 29, 2010, published in Phys. Rev. Lett. 105, 227003 (2010). 6 pages.

T. Karzig, C. Knapp, R. M. Lutchyn, P. Bonderson, M. B. Hastings, C. Nayak, J. Alicea, K. Flensberg, S. Plugge, Y. Oreg, C. M. Marcus, and M. H. Freedman, "Scalable designs for quasiparticle-poisoning-protected topological quantum computation with Majorana zero modes" Phys. Rev. B 95, 235305 (2017). 32 pages.

F. D. M. Haldane, "Model for a quantum Hall effect without Landau levels: Condensed-matter realization of the parity anomaly" Phys. Rev. Lett. 61, 2015 (1988). 4 pages.

M. Onoda and N. Nagaosa, "Quantized Anomalous Hall Effect in Two-Dimensional Ferromagnets—Quantum Hall Effect from Metal—" arXiv:cond-mat/0301482v1 [cond-mat.mes-hall] Jan. 24, 2003, published in Phys. Rev. Lett. 90, 206601 (2003). 6 pages.

R. Yu, W. Zhang, H.-J. Zhang, S.-C. Zhang, X. Dai, and Z. Fang, "Quantized Anomalous Hall Effect in Magnetic Topological Insulators" arXiv:1002.0946v1 [cond-mat.mes-hall] Feb. 4, 2010, published in Science 329, 61 (2010). 20 pages.

S.-C. Wu, G. Shan, and B. Yan, "Prediction of Near-Room-Temperature Quantum Anomalous Hall Effect on Honeycomb Materials" arXiv:1405.4731v2 [cond-mat.mtrl-sci] Jul. 23, 2014, published in Phys. Rev. Lett. 113, 256401 (2014). 7 pages.

S. Qi, Z. Qiao, X. Deng, E. D. Cubuk, H. Chen, W. Zhu, E. Kaxiras, S. B. Zhang, X. Xu, and Z. Zhang, "High-Temperature Quantum Anomalous Hall Effect in n-p Codoped Topological Insulators" arXiv:1507.03218v1 [cond-mat.mtrl-sci] Jul. 12, 2015, published in Phys. Rev. Lett. 117, 056804 (2016). 6 pages.

C. Huang, J. Zhou, H. Wu, K. Deng, P. Jena, and E. Kan, "Quantum anomalous Hall effect in ferromagnetic transition metal halides" Phys. Rev. B 95, 045113 (2017). 23 pages.

Y. Deng, Y. Yu, M. Z. Shi, Z. Guo, Z. Xu, J.Wang, X. H. Chen, and Y. Zhang, "Quantum anomalous Hall effect in intrinsic magnetic topological insulator MnBi2Te4" Science 367, 895 (2020). 6 pages.

H. Deng, Z. Chen, A. Wo lo_s, M. Konczykowski, K. Sobczak, J. Sitnicka, I. V. Fedorchenko, J. Borysiuk, T. Heider, L. Pluci_nski, K. Park, A. B. Georgescu, J. Cano, and L. Krusin-Elbaum, "Observation of high-temperature quantum anomalous Hall regime in intrinsic MnBi2Te4/Bi2Te3 superlattice" arXiv:2001.10579v1 [cond-mat.mtrl-sci] Jan. 28, 2020, published in Nature Physics (2020), 10.1038/s41567-020-0998-2. 15 pages.

J. Alicea, "Majorana fermions in a tunable semiconductor device" Phys. Rev. B 81, 125318 (2010). 10 pages.

K. T. Law, P. A. Lee, and T. K. Ng, "Majorana Fermion Induced Resonant Andreev Reflection" Phys. Rev. Lett. 103, 237001 (2009). 4 pages.

M. Wimmer, A. R. Akhmerov, J. P. Dahlhaus, and C. W. J. Beenakker, "Quantum point contact as a probe of a topological superconductor" New Journal of Physics 13, 053016 (2011). 11 pages.

D. S. Fisher and P. A. Lee, "Relation between conductivity and transmission matrix" Phys. Rev. B 23, 6851 (1981). 4 pages.

Q. feng Sun and X. C. Xie, "Quantum transport through a graphene nanoribbon-superconductor junction" arXiv:0904.2838v1 [cond-mat.mes-hall] Apr. 18, 2009, published in Journal of Physics: Condensed Matter 21, 344204 (2009). 24 pages.

J. Liu, A. C. Potter, K. T. Law, and P. A. Lee, "Zero-Bias Peaks in the Tunneling Conductance of SpinOrbit-Coupled Superconducting Wires with and without Majorana End-States" Phys. Rev. Lett. 109, 267002 (2012). 6 pages.

J. Liu, F.-C. Zhang, and K. T. Law, "Majorana fermion induced nonlocal current correlations in spinorbit coupled superconducting wires" Phys. Rev. B 88, 064509 (2013). 8 pages.

P. Bonderson, M. Freedman, and C. Nayak, "Measurement-Only Topological Quantum Computation" arXiv:0802.0279v2 [quant-ph] Aug. 15, 2008, published in Phys. Rev. Lett. 101, 010501 (2008). 5 pages.

S. Vijay, T. H. Hsieh, and L. Fu, "Majorana Fermion Surface Code for Universal Quantum Computation" Phys. Rev. X 5, 041038 (2015). 17 pages.

S. Vijay and L. Fu, "Teleportation-based quantum information processing with Majorana zero modes" Phys. Rev. B 94, 235446 (2016). 9 pages.

Zhen Zhu, Hao Zheng, and Jin-feng Jia, "Majorana zero mode in the vortex of artificial topological superconductor" J. Appl. Phys. 129, 151104 (2021), 20 pages.

Zi-Xiang Li, Cheung Chan, and Hong Yao, "Realizing Majorana zero modes by proximity effect between topological insulators and d-wave high-temperature superconductors" Physical Review B 91, 235143 (2015) 5 pages.

Manna et al. "Signature of a pair of Majorana zero modes in superconducting gold surface states" [www.pnas.org/cgi/doi/10.1073/pnas.1919753117] PNAS | Apr. 21, 2020 | vol. 117 | No. 16 | pp. 8775-8782.

He et al. "Chiral Majorana fermion modes in a quantum anomalous Hall insulator-superconductor structure" Science 357, 294-299 (2017) Jul. 21, 2017, 6 pages.

He et al. "Selective Equal-Spin Andreev Reflections Induced by Majorana Fermions" arXiv:1309.1528v3 [cond-mat.mes-hall] Dec. 4, 2014, 5 pages.

D. A. Ivanov, "Non-abelian statistics of half-quantum vortices in p-wave superconductors" arXiv:cond-mat/0005069v2 [cond-mat.supr-con] May 11, 2000, published in Phys. Rev. Lett. 86, 268 (2001). 5 pages.

C. Nayak, S. H. Simon, A. Stern, M. Freedman, and S. Das Sarma, "Non-Abelian anyons and topological quantum computation" arXiv:0707.1889v2 [cond-mat.str-el] Mar. 28, 2008, published in Rev. Mod. Phys. 80, 1083 (2008). 73 pages.

A. Kitaev, "Fault-tolerant quantum computation by anyons" arXiv:quant-ph/9707021v1 Jul. 9, 1997, published in Annals of Physics 303, 2 (2003). 27 pages.

J. Alicea, Y. Oreg, G. Refael, F. von Oppen, and M. P. A. Fisher, "Non-Abelian statistics and topological quantum information processing in 1D wire networks" arXiv:1006.4395v2 [cond-mat.mes-hall] Sep. 19, 2010, published in Nature Physics 7, 412 (2011). 23 pages.

D. Aasen, M. Hell, R. V. Mishmash, A. Higginbotham, J. Danon, M. Leijnse, T. S. Jespersen, J. A. Folk, C. M. Marcus, K. Flensberg, and J. Alicea, "Milestones Toward Majorana-Based Quantum Computing" Phys. Rev. X 6, 031016 (2016). 28 pages.

N. Read and D. Green, "Paired states of fermions in two dimensions with breaking of parity and time-reversal symmetries and the fractional quantum Hall effect" arXiv:cond-mat/9906453v3 [cond-mat.mes-hall] Jan. 24, 2000, published in Phys. Rev. B 61, 10267 (2000). 35 pages.

A. Y. Kitaev, "Unpaired Majorana fermions in quantum wires" arXiv:cond-mat/0010440v2 [cond-mat.mes-hall] Oct. 30, 2000, published in Physics-Uspekhi 44, 131 (2001). 16 pages.

(56) References Cited

OTHER PUBLICATIONS

L. Fu and C. L. Kane, "Superconducting Proximity Effect and Majorana Fermions at the Surface of a Topological Insulator" arXiv:0707.1692v3 [cond-mat. mes-hall] Apr. 28, 2008, published in Phys. Rev. Lett. 100, 096407 (2008). 4 pages.
Y. Oreg, G. Refael, and F. von Oppen, "Helical liquids and Majorana bound states in quantum wires" arXiv:1003.1145v2 [cond-mat.mes-hall] Jun. 10, 2010, published in Phys. Rev. Lett. 105, 177002 (2010). 5 pages.
J. D. Sau, R. M. Lutchyn, S. Tewari, and S. Das Sarma, "A generic new platform for topological quantum computation using semiconductor heterostructures" arXiv:0907.2239v3 [cond-mat.str-el] Jan. 12, 2010, published in Phys. Rev. Lett. 104, 040502 (2010). 4 pages.
R. M. Lutchyn, J. D. Sau, and S. Das Sarma, "Majorana Fermions and a Topological Phase Transition in Semiconductor-Superconductor Heterostructures" arXiv: 1002.4033v2 [cond-mat.supr-con] Aug. 13, 2010, published in Phys. Rev. Lett. 105, 077001 (2010). 5 pages.
R. M. Lutchyn, T. D. Stanescu, and S. Das Sarma, "Search for Majorana fermions in multiband semiconducting nanowires" arXiv:1008.0629v2 [cond-mat.supr-con] Feb. 20, 2011, published in Phys. Rev. Lett. 106, 127001 (2011). 4 pages.
T.-P. Choy, J. M. Edge, A. R. Akhmerov, and C. W. J. Beenakker, "Majorana fermions emerging from magnetic nanoparticles on a superconductor without spin-orbit coupling" arXiv:1108.0419v1 [cond-mat.mes-hall] Aug. 1, 2011, published in Phys. Rev. B 84, 195442 (2011). 7 pages.
J. Klinovaja, P. Stano, A. Yazdani, and D. Loss, "Topological Superconductivity and Majorana Fermions in RKKY Systems" arXiv:1307.1442v1 [cond-mat.mes-hall] Jul. 4, 2013, published in Phys. Rev. Lett. 111, 186805 (2013). 6 pages.
A. C. Potter and P. A. Lee, "Topological Superconductivity and Majorana Fermions in Metallic Surface-States" arXiv:1201.2176v1 [cond-mat.mes-hall] Jan. 10, 2012, published in Phys. Rev. B 85, 094516 (2012). 9 pages.
Y.-M. Xie, K. T. Law, and P. A. Lee, "Topological superconductivity in EuS/Au/superconductor heterostructures" arXiv:2003.07052v2 [cond-mat.supr-con] Oct. 4, 2021. 23 pages.
C.-Z. Chen, Y.-M. Xie, J. Liu, P. A. Lee, and K. T. Law, "Quasi-one-dimensional Quantum Anomalous Hall Systems as New Platforms for Scalable Topological Quantum Computation" arXiv:1709.10474v1 [cond-mat.supr-con] Sep. 29, 2017, published in Phys. Rev. B 97, 104504 (2018). 5 pages.
Y. Zeng, C. Lei, G. Chaudhary, and A. H. MacDonald, "The Quantum Anomalous Hall Majorana Platform" arXiv:1710.06823v4 [cond-mat.mes-hall] Jan. 30, 2018, published in Phys. Rev. B 97, 081102 (2018). 8 pages.
V. Mourik, K. Zuo, S. M. Frolov, S. R. Plissard, E. P. A. M. Bakkers, and L. P. Kouwenhoven, "Signatures of Majorana fermions in hybrid superconductor-semiconductor nanowire devices" Science 336, 1003 (2012). 28 pages.
L. P. Rokhinson, X. Liu, and J. K. Furdyna, "The fractional a.c. Josephson effect in a semiconductor-superconductor nanowire as a signature of Majorana particles" Nature Physics 8, 795 (2012). 5 pages.
A. Das, Y. Ronen, Y. Most, Y. Oreg, M. Heiblum, and H. Shtrikman, "Zero-bias peaks and splitting in an Al—InAs nanowire topological superconductor as a signature of Majorana fermions" Nature Physics 8, 887 (2012). 9 pages.
M. T. Deng, C. L. Yu, G. Y. Huang, M. Larsson, P. Caroff, and H. Q. Xu, "Anomalous zero-bias conductance peak in a Nb—InSb nanowire-Nb hybrid device" Nano Letters 12, 6414 (2012). 6 pages.
S. Nadj-Perge, I. K. Drozdov, J. Li, H. Chen, S. Jeon, J. Seo, A. H. MacDonald, B. A. Bernevig, and A. Yazdani, "Observation of Majorana Fermions in Ferromagnetic Atomic Chains on a Superconductor" Science 346, 602 (2014). 45 pages.
S. M. Albrecht, A. P. Higginbotham, M. Madsen, F. Kuemmeth, T. S. Jespersen, J. Nyg_ard, P. Krogstrup, and C. M. Marcus, "Exponential Protection of Zero Modes in Majorana Islands" arXiv:1603.03217v1 [cond-mat.mes-hall] Mar. 10, 2016, published in Nature 531, 206 (2016). 14 pages.
H. Zhang, C.-X. Liu, S. Gazibegovic, D. Xu, J. A. Logan, G. Wang, N. van Loo, J. D. S. Bommer, M. W. A. de Moor, D. Car, R. L. M. Op het Veld, P. J. van Veldhoven, S. Koelling, M. A. Verheijen, M. Pendharkar, D. J. Pennachio, B. Shojaei, J. S. Lee, C. J. Palmstr_m, E. P. A. M. Bakkers, S. D. Sarma, and L. P. Kouwenhoven, "Quantized majorana conductance" Nature 556, 74 (2018). 26 pages.
B. Jack, Y. Xie, J. Li, S. Jeon, B. A. Bernevig, and A. Yazdani, "Observation of a Majorana zero mode in a topologically protected edge channel" Science 364, 1255 (2019). 21 pages.
A. Fornieri, A. M. Whiticar, F. Setiawan, E. Portoles, A. C. C. Drachmann, A. Keselman, S. Gronin, C. Thomas, T. Wang, R. Kallaher, G. C. Gardner, E. Berg, M. J. Manfra, A. Stern, C. M. Marcus, and F. Nichele, "Evidence of topological superconductivity in planar Josephson junctions" arXiv:1809.03037v1 [cond-mat.mes-hall] Sep. 9, 2018, published in Nature 569, 89 (2019). 18 pages.
H. Ren, F. Pientka, S. Hart, A. T. Pierce, M. Kosowsky, L. Lunczer, R. Schlereth, B. Scharf, E. M. Hankiewicz, L.W. Molenkamp, B. I. Halperin, and A. Yacoby, "Topological Superconductivity in a Phase-Controlled Josephson Junction" arXiv:1809.03076v1 [cond-mat.mes-hall] Sep. 10, 2018, published in Nature 569, 93 (2019). 65 pages.
J.-P. Xu, M.-X. Wang, Z. L. Liu, J.-F. Ge, X. Yang, C. Liu, Z. A. Xu, D. Guan, C. L. Gao, D. Qian, Y. Liu, Q.-H. Wang, F.-C. Zhang, Q.-K. Xue, and J.-F. Jia, "Experimental Detection of a Majorana Mode in the core of a Magnetic Vortex inside a Topological Insulator-Superconductor Bi2Te3=NbSe2 Heterostructure" Phys. Rev. Lett. 114, 017001 (2015). 6 pages.
H.-H. Sun, K.-W. Zhang, L.-H. Hu, C. Li, G.-Y. Wang, H.-Y. Ma, Z.-A. Xu, C.-L. Gao, D.-D. Guan, Y.-Y. Li, C. Liu, D. Qian, Y. Zhou, L. Fu, S.-C. Li, F.-C. Zhang, and J.-F. Jia, "Observation of Majorana fermions with spin selective Andreev reflection in the vortex of topological superconductor" Phys. Rev. Lett. 116, 257003 (2016). 15 pages.
D. Wang, L. Kong, P. Fan, H. Chen, S. Zhu, W. Liu, L. Cao, Y. Sun, S. Du, J. Schneeloch, R. Zhong, G. Gu, L. Fu, H. Ding, and H.-J. Gao, "Evidence for Majorana bound state in an iron-based superconductor" Science 362, 333 (2018). 27 pages.
S. Manna, P. Wei, Y. Xie, K. T. Law, P. A. Lee, and J. S. Moodera, "Signature of a pair of Majorana zero modes in superconducting gold surface states" Proceedings of the National Academy of Sciences 117, 8775 (2020). 8 pages.
S. Vaitiekenas, G. W. Winkler, B. van Heck, T. Karzig, M.-T. Deng, K. Flensberg, L. I. Glazman, C. Nayak, P. Krogstrup, R. M. Lutchyn, and C. M. Marcus, "Flux-induced topological superconductivity in full-shell nanowires" bendarXiv: 2003.13177v1 [cond-mat.mes-hall] Mar. 30, 2020, published in Science 367 (2020), 10.1126/science.aav3392. 38 pages.
Y. Xie, B. T. Zhou, T. K. Ng, and K. T. Law, "Strongly enlarged topological regime and enhanced superconducting gap in nanowires coupled to Ising superconductors" Phys. Rev. Research 2, 013026 (2020). 9 pages.
C.-Z. Chang, J. Zhang, X. Feng, J. Shen, Z. Zhang, M. Guo, K. Li, Y. Ou, P. Wei, L.-L. Wang, Z.-Q. Ji, Y. Feng, S. Ji, X. Chen, J. Jia, X. Dai, Z. Fang, S.-C. Zhang, K. He, Y. Wang, L. Lu, X.-C. Ma, and Q.-K. Xue, "Experimental observation of the quantum anomalous Hall effect in a magnetic topological insulator" Science 340, 167 (2013). 5 pages.
J. G. Checkelsky, R. Yoshimi, A. Tsukazaki, K. S. Takahashi, Y. Kozuka, J. Falson, M. Kawasaki, and Y. Tokura, "Trajectory of the anomalous Hall eect towards the quantized state in a ferromagnetic topological insulator" Nature Physics 10, 731 (2014). 6 pages.
X. Kou, S.-T. Guo, Y. Fan, L. Pan, M. Lang, Y. Jiang, Q. Shao, T. Nie, K. Murata, J. Tang, Y. Wang, L. He, T.-K. Lee, W.-L. Lee, and K. L. Wang, "Scale-Invariant Quantum Anomalous Hall Effect in Magnetic Topological Insulators beyond the Two-Dimensional Limit" Phys. Rev. Lett. 113, 137201 (2014). 5 pages.

(56) References Cited

OTHER PUBLICATIONS

A. J. Bestwick, E. J. Fox, X. Kou, L. Pan, K. L. Wang, and D. Goldhaber-Gordon, "Precise quantization of anomalous Hall effect near zero magnetic field" Phys. Rev. Lett. 114, 187201 (2015). 16 pages.

Y. Feng, X. Feng, Y. Ou, J. Wang, C. Liu, L. Zhang, D. Zhao, G. Jiang, S.-C. Zhang, K. He, X. Ma, Q.-K. Xue, and Y. Wang, "Observation of the Zero Hall Plateau in a Quantum Anomalous Hall Insulator" Phys. Rev. Lett. 115, 126801 (2015). 6 pages.

C.-Z. Chang, W. Zhao, D. Y. Kim, H. Zhang, B. A. Assaf, D. Heiman, S.-C. Zhang, C. Liu, M. H. W. Chan, and J. S. Moodera, "High-precision realization of robust quantum anomalous Hall state in a hard ferromagnetic topological insulator" Nature Materials 14, 473 (2015). 5 pages.

A. Kandala, A. Richardella, S. Kempinger, C.-X. Liu, and N. Samarth, "Giant anisotropic magnetoresistance in a quantum anomalous Hall insulator" Nature Communications 6, 7434 (2015). 6 pages.

X.-L. Qi, T. L. Hughes, and S.-C. Zhang, "Chiral Topological Superconductor From the Quantum Hall State" Phys. Rev. B 82, 184516 (2010). 5 pages.

Q. L. He, L. Pan, A. L. Stern, E. C. Burks, X. Che, G. Yin, J. Wang, B. Lian, Q. Zhou, E. S. Choi, K. Murata, X. Kou, Z. Chen, T. Nie, Q. Shao, Y. Fan, S.-C. Zhang, K. Liu, J. Xia, and K. L. Wang, "Chiral Majorana fermion modes in a quantum anomalous Hall insulator-superconductor structure" Science 357, 294 (2017). 7 pages.

J. Shen, J. Lyu, J. Z. Gao, Y.-M. Xie, C.-Z. Chen, C.-w. Cho, O. Atanov, Z. Chen, K. Liu, Y. J. Hu, K. Y. Yip, S. K. Goh, Q. L. He, L. Pan, K. L. Wang, K. T. Law, and R. Lortz, "Spectroscopic fingerprint of chiral Majorana modes at the edge of a quantum anomalous Hall insulator/ superconductor heterostructure" Proceedings of the National Academy of Sciences 117, 238 (2020). 5 pages.

J. Wang, Q. Zhou, B. Lian, and S.-C. Zhang, "Chiral topological superconductor and half-integer conductance plateau from quantum anomalous Hall plateau transition" Phys. Rev. B 92, 064520 (2015). 10 pages.

Y. Huang, F. Setiawan, and J. D. Sau, "Disorder-induced half-integer quantized conductance plateau in quantum anomalous Hall insulator-superconductor structures" arXiv:1708.06752v4 [cond-mat.supr-con] Mar. 14, 2018, published in Phys. Rev. B 97, 100501 (2018). 14 pages.

W. Ji and X.-G. Wen, "1/2 (e[superscript 2]/h) Conductance Plateau without 1D Chiral Majorana Fermions" Phys. Rev. Lett. 120, 107002 (2018). 6 pages.

\* cited by examiner

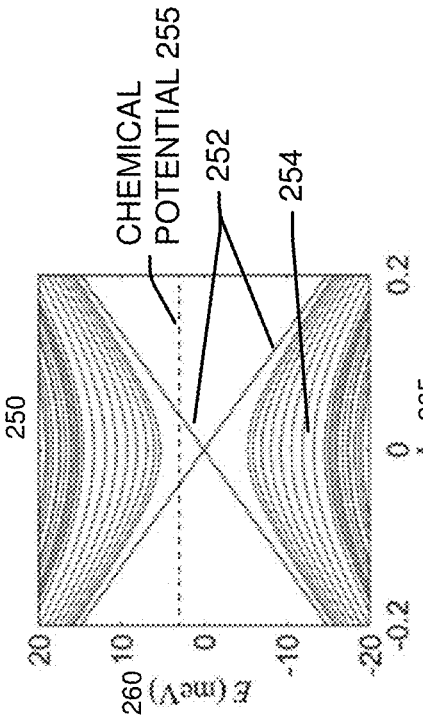
FIG. 2A
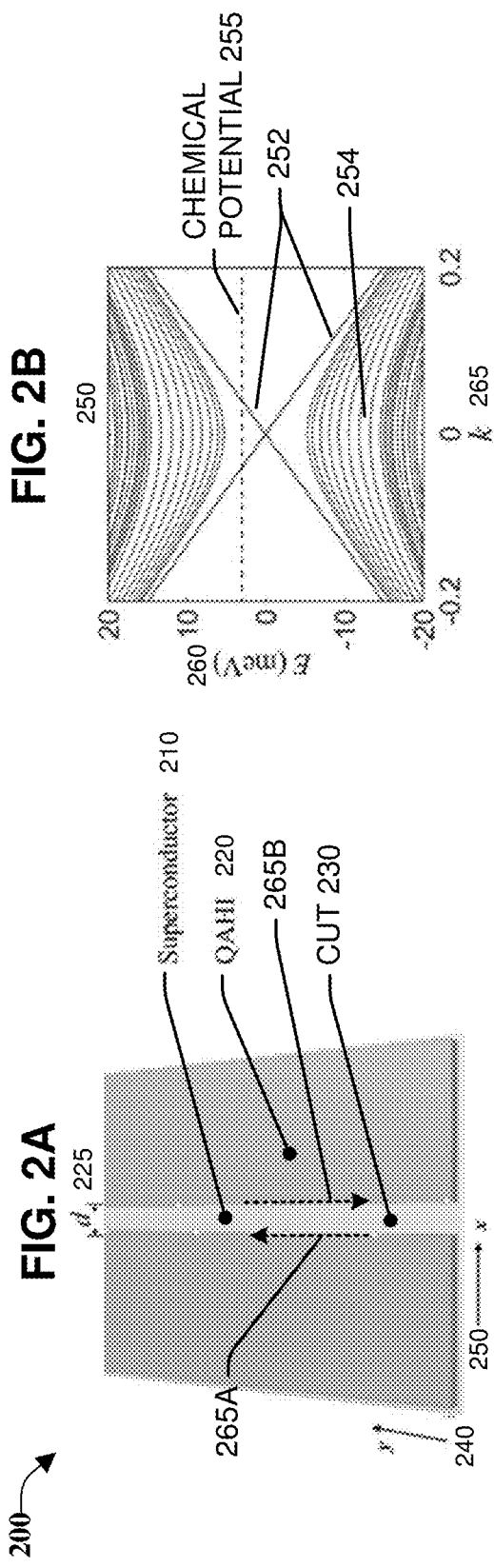
FIG. 2B
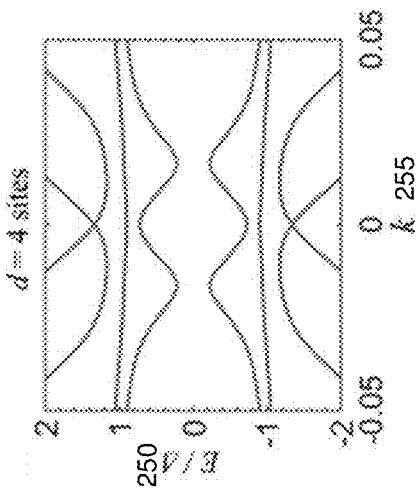
FIG. 2E
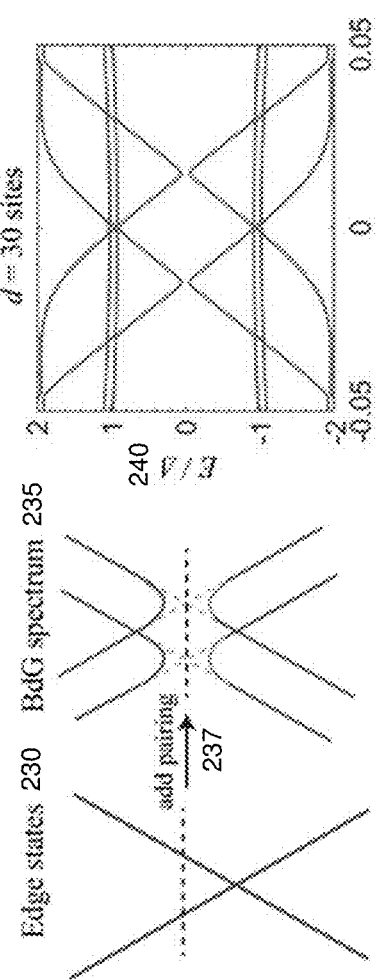
FIG. 2C
FIG. 2D

700

702 — COMBINING A SUPERCONDUCTING MATERIAL WITH A QUANTUM ANOMALOUS HALL INSULATOR (QAHI) MATERIAL, SO THAT THROUGH PROXIMITY EFFECTS, SUPERCONDUCTIVITY CAN BE INDUCED ONTO THE QAHI

704 — MAKING A CUT OF A WIDTH COMPARABLE TO THE COHERENCE LENGTH OF THE SUPERCONDUCTOR, WHEREIN THE TOPOLOGICALLY PROTECTED HELICAL CHANNELS ON THE EDGES OF THE CUT CAN COUPLE TO EACH OTHER THROUGH THE SUPERCONDUCTOR

FIG. 7

CREATING MAJORANA ZERO MODES IN QUANTUM ANOMALOUS HALL INSULATOR/SUPERCONDUCTOR HETEROSTRUCTURES

RELATED APPLICATION

The subject application claims the benefit of priority to U.S. Provisional Appln. No. 63/149,666, filed Feb. 16, 2021, the entirety of which priority application is hereby incorporated by reference herein in its entirety.

TECHNICAL FIELD

The subject application is related to different approaches to implementing quantum computation systems and, for example, to creating and manipulating Majorana zero-energy mode quasiparticles.

BACKGROUND

The search for Majorana zero-energy mode (MZM) quasiparticles has been an important subject in condensed matter systems due to their exotic non-Abelian statistics, and potential applications in fault-tolerant topological quantum computation. Efforts have been made on engineering topological superconductors that support MZMs using superconductors with conventional s-wave pairing. Notable examples of these systems include the heterostructures of superconductors with topological insulators, semiconductor nanowires, ferromagnetic chains, metallic surface states, and quantum anomalous Hall insulators (QAHIs)

Notwithstanding progress being made, to realize practical topological quantum computation with MZMs, some problems may need to be addressed. For example, many proposed MZM implementations have small experimental parameter regimes in which MZMs can be experimentally realized. Therefore, concrete experimental evidence of MZMs is still lacking, and a platform with a large topological regime, where MZMs can be easily realized, remains to be found. In addition, in some circumstances MZMs may operate more effectively when they are separated in energy from other quasiparticle excitations. Also, for quantum computation, a system which can host a large number of MZMs may be required.

BRIEF DESCRIPTION OF THE DRAWINGS

The technology described herein is illustrated by way of example and not limited in the accompanying figures in which like reference numerals indicate similar elements and in which:

FIG. 2A depicts a schematic plot of a quantum anomalous Hall insulator/superconductor geometry for generating Majorana zero-energy modes, in accordance with one or more embodiments.

FIG. 2B is a chart of an example energy spectrum for the example geometry to create Majorana zero-energy modes discussed with FIG. 2A, in accordance with one or more embodiments.

FIG. 2C is an example chart of energy spectrum from an implentation where chemical potential is inside the bulk gap in the QAHI and superconductivity is induced, in accordance with one or more embodiments.

FIG. 2D and FIG. 2E are example charts of energy spectrum from an implentations of different example sizes, in accordance with one or more embodiments.

FIG. 7 and FIG. 8 together form a method that can facilitate topological quantum computation.

DETAILED DESCRIPTION

Generally speaking, one or more embodiments can facilitate creating Majorana zero-energy modes (MZMs) in different circumstances. For example, in one or more embodiments, Majorana zero-energy modes (MZMs) can be created by making a cut (e.g., a narrow vacuum regime) in the bulk of a quantum anomalous Hall insulator (QAHI). In some implementations, the cut can create a topologically protected single helical channel with counter-propagating electron modes, and this can result in the creation of MZMs, e.g., by inducing superconductivity on the helical channel through superconducting proximity effects. In a word, based on the above structure, for some embodiments described herein, the MZMs can be created at one or both ends of the cut.

In additional embodiments, the above geometry can avoid a requirement of a large superconducting proximity gap to overcome the bulk insulating gap of the QAHI. In one or more embodiments, a superconducting proximity gap larger than the bulk insulating gap of the QAHI can be useful for creating MZMs with two-dimensional QAHI/superconductor (QAHI/SC) heterostructures. One having skill in the relevant art(s), given the description herein, appreciates that removing the requirement of having a large superconducting proximity gap to overcome the bulk insulating gap can greatly enlarge the topological regime, in which MZMs can be created. In addition, this enlarging of the topological regime of MZMs can be achieved by making a cut in the QAHI as a single helical channel. Another advantage of one or more embodiments described herein, is avoiding the generation of unwanted low energy in-gap bound states caused by multiple conducting channels, in some circumstances.

Based at least on the example features discussed above, one or more embodiments can be used to create MZMs in devices with complicated geometry, e.g., hexons used for measurement-based topological quantum computation. In addition, as discussed further below, in some circumstances, one or more embodiments can facilitate braiding of MZMs, e.g., by controlling the coupling strength between the counter-propagating electron modes.

Aspects of the subject disclosure will now be described more fully hereinafter with reference to the accompanying drawings in which example components, graphs and selected operations are shown. In the following description, for purposes of explanation, numerous specific details are set forth in order to provide a more thorough understanding of the various embodiments. It should be noted that the subject disclosure may be embodied in many different forms and should not be construed as limited to particular examples set forth or suggested herein.

Figure 1:
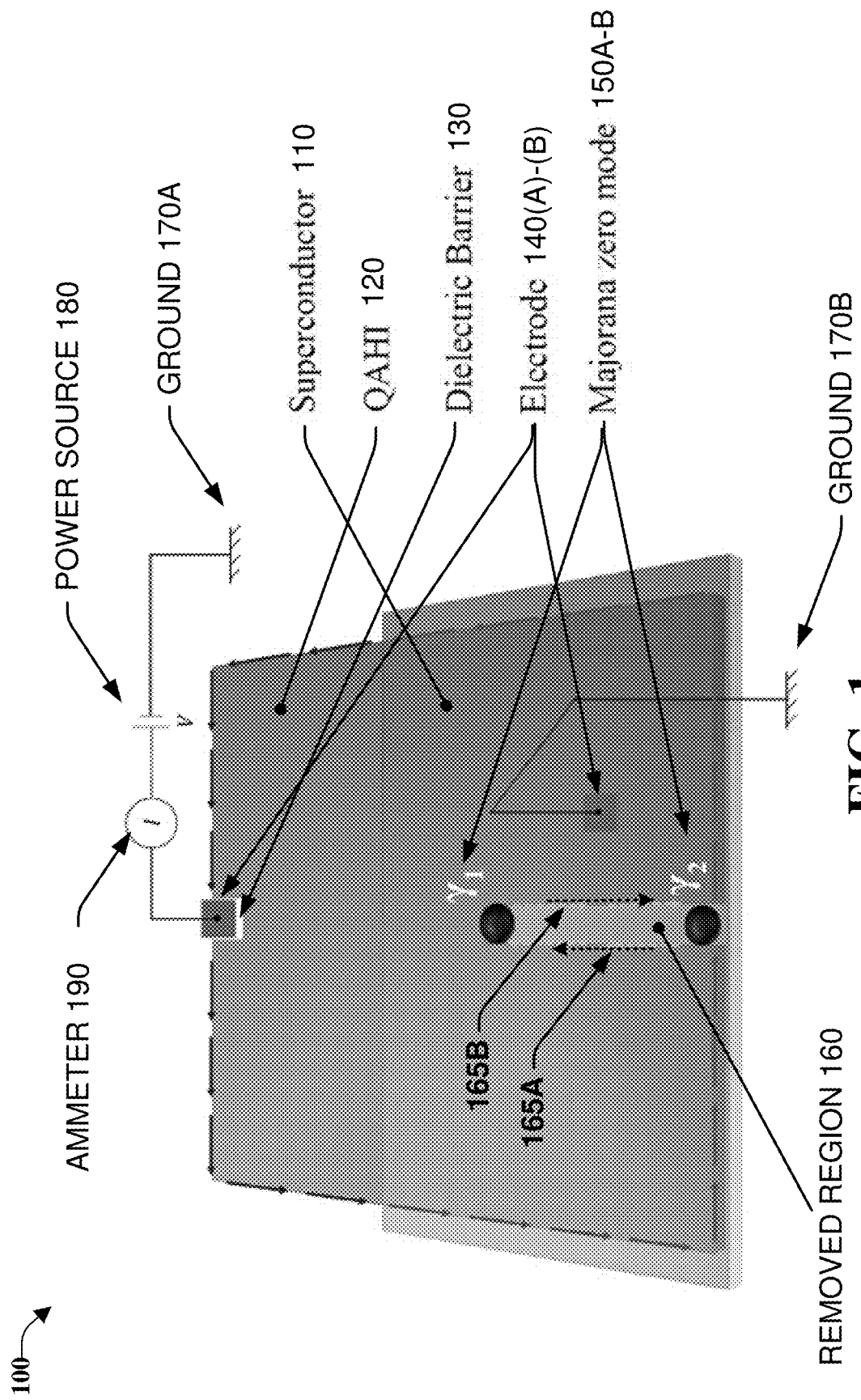
FIG. 1 is a diagram of an example system that can facilitate generating Majorana zero-energy modes, in accordance with one or more embodiments.

FIG. 1 is a diagram of an example system 100 that can facilitate generating MZMs, in accordance with one or more embodiments. For purposes of brevity, description of like elements and/or processes employed in other embodiments is omitted. System 100 can include superconductor 110 coupled to a QAHI 120 with a removed region 160, in accordance with one or more embodiments. As depicted, ammeter 190 is connected to superconductor 110 via electrode 140A and dielectric barrier 130, with power source 180 and ground 170A. Superconductor 110 is further connected to ground 170B via electrode 140B. On either side of removed region 160, counter-propagating chiral edge modes of the QAHI 165A-B are shown.

In one or more non-limiting examples described herein, a cut (a vacuum region or removed region 160) in the bulk of a QAHI 120 can create a single helical channel formed by two counter-propagating chiral edge modes. As depicted, QAHI 120 with removed region 160 is coupled to a superconductor 110 with created MZMs 150 at the ends of removed region 160.

In one or more embodiments, the width of removed region 160 can be, but is not limited to, in the order of tens of nanometers, with this width being comparable to the coherence length of a typical superconductor 110. In the example geometry depicted, the coupling of the edge modes can be mediated by a gapped superconductor 110 so that the edge modes do not hybridize too strongly and thereby gap out each other.

At least by using this geometry, in one or more embodiments the superconducting gap does not have to overcome the bulk insulating gap of QAHI 120 to create MZMs 150 and, in some circumstances, this can greatly enlarge the topological regime of MZMs 150 created. This contrasts with approaches to using a similar two-dimensional QAHI 120/superconductor 110 (QAHI 120/SC 110) heterostructure in which the bulk insulating gap must be smaller than the superconducting gap, e.g. in some circumstances only potentially creating chiral Majorana modes on the edge.

It is further noted that, in some implementations of system 100, the presence of a single helical channel can be caused by the bulk topological property of QAHI 120 and no other conducting channels are created. In some circumstances, avoiding the creation of other conducting channels can beneficially avoid the generation of low-energy in-gap bound states caused by multiple conducting channels, e.g., as in some multi-channel nanowires. As discussed with FIG. 4 below, having multiple removed regions 160 can create a relatively large number of MZMs as compared to some other approaches, with this number and structure of MZMs facilitating the fabrication of qubit structures including, but not limited to, topological qubits such as hexons. In addition, given some of the examples described herein, braiding operations with the MZMs can be performed, e.g., by tuning the coupling strength of the counter-propagating chiral edge modes.

In one or more embodiments, a narrow cut in QAHI 120 (e.g., removed region 160) can result in topological superconductivity in the QAHI 120/SC 110 heterostructure. The chiral edge modes of two-dimensional QAHIs 120 are protected by the topologically non-trivial bulk band structure. When the width of QAHI 120 is comparable to the superconducting coherence length of the superconductor, the two counter-propagating chiral edge states residing on the opposite side of the cut 165A, 165B would couple to each other through the superconductor, and result in the creation of MZMs.

In circumstances where superconductivity is induced on a helical channel by proximity from a superconductor 110, MZMs 150 can be created in such a quasi-one-dimensional QAHI 120/SC 110 heterostructure. Generally speaking however, for this scheme of creating MZMs 150, in certain circumstances can require the separation of the edge modes to be comparable to the coherence length of the superconductor 110. However, in practice, the localization length of the chiral edge modes in some QAHI 120 can be too localized 110, thus an extremely narrow QAHI wire (e.g., less than 100 nanometers) is needed and would possibly be very disordered. One having skill in the relevant art(s), given the description herein, appreciates that MZMs can be difficult to create in a quasi-one-dimensional QAHI 120/SC 110 heterostructure without the removed region 160 of embodiments, as illustrated in FIG. 1.

An alternative approach used by one or more embodiments, is described with FIG. 2 below, e.g., with alternative results being achieved in some circumstances by using a single helical channel to create a narrow vacuum strip (e.g., removed region 160) in QAHI 120, as depicted in FIG. 1. In this example, superconductivity can be induced by covering a superconductor 110 on the top of removed region 160.

As depicted, MZMs 150A-B, labeled $\gamma_1$ and $\gamma_2$ respectively, are created at both ends of removed region 160 of QAHI 120. In an implementation, MZM 150B, at the end of the cut can be localized, while MZM 150A, at the beginning of the cut, can be delocalized, e.g., due to the extended gapless chiral edge modes. Furthermore, because the chiral edge states are protected by the bulk topological property, the edge states can circumvent the narrow cut and generate a pair of counter-propagating edge modes 165A-B.

In one or more embodiments, the two chiral modes can advantageously form a helical channel in close proximity of each other, and thereby enable superconductor 110, with relatively short coherence length in this example, to induce superconductivity on the edge modes. Of further advantage in the example shown, the two edge states are coupled to each other only indirectly through the gapped superconductor 110, e.g., so that they will not hybridize too strongly and do not easily gap out each other. In yet another advantage, MZMs 150 can be created whenever a pairing gap is induced on the helical channel, with this induced pairing gap not having to overcome the bulk insulating gap of QAHI 120. At least because of this, using one or more embodiments, QAHIs 120 with large bulk insulating gaps can be used to create MZMs. Thus, as more and more QAHIs 120 with large bulk insulating gaps are sought to be used, one or more embodiments can allow MZMs to be created on these robust topological platforms. Based at least on the foregoing, one or more embodiments contrast from other two-dimensional QAHI 120/SC heterostructures which require the pairing gap to overcome the bulk insulating gap, e.g., this which cannot be achieved in QAHI 120s with large insulating bulk gaps.

To illustrate one way that one or more embodiments can use helical edge modes in proximity to a superconductor 110 to induce topological superconductivity, a low energy effective Hamiltonian for the two chiral edge modes near the cut region as shown in FIG. 1 is included below.

The effective Hamiltonian can be written as:

$$H_{eff} = \Sigma_{k_y} \Psi_{k_y}^\dagger \mathcal{H}_{BdG}(k_y) \Psi_{k_y}$$

in the Nambu basis:

$$\Psi_{k_y}=(\psi_{R,k_y},\psi_{L,k_y},\psi_{R,-k_y}^\dagger,\psi_{L,-k_y}^\dagger)^T \text{ and}$$

the Bogoliubov-de Gennes (BdG) Hamiltonian:

$$\mathcal{H}_{BdG}(k_x)=v_0 k_y \rho_z+c(k_y)\rho_x \xi_z-\mu\xi_z-\Delta_0\rho_y\xi_y, \quad \text{(Equation \#1)}$$

where $\psi_{R(L),k_y}$ is the annihilation operator of edge states with momentum $k_y$ at right (left) edge near the cut, $\rho$ and $\xi$ are Pauli matrices operating on (L,R) and particle-hole space respectively, $v_0$ denotes the velocity of chiral edge states, $c(k_y)=c_0+c_1 k_y^2$ describes the coupling between left-moving and right-moving edge states, N denotes the chemical potential and $\Delta_0$ is the amplitude of proximitized superconducting pairing. Note that $\Delta_0$ depends on the coupling strength between two chiral edge states $c(k_y)$ implicitly.

To see that Hamiltonian (Equation #1) describes a topological superconductor, the example included below can project out the pairing onto the conduction band:

$$E_\pm=\pm\sqrt{v_0^2 k_y^2+c^2(k_y)}-\mu \text{ and}$$

obtain an effective intra-band p-wave pairing:

$$\Delta_{\mathit{eff}}(k_y) = U^\dagger(k_y)\Delta_0 i\rho_y U^*(-k_y) = \frac{v_0 k_y \Delta_0}{\sqrt{(v_0 k_y)^2 + c(k_y)^2}}, \quad \text{(Equation \#2)}$$

where the projection operation $U(k_y)=|E_+(k_y)\rangle \langle E_+(k_y)|$ with $|E_+(k_y)\rangle$ as the eigen-wavefunction of the conduction band $E_+(k_y)$.

This p-wave pairing results in a 1D topological superconductor. The topological region can be $|c_0|<\sqrt{\Delta_0^2+\mu^2}$, which can be determined by the gap-closing point of the BdG energy spectrum of $\mathcal{H}_{BdG}(k_y)$ at $k_y=0$. In the strong pairing limit, where $\Delta>c_0$, this system can be topological. In the weak pairing limit, where $\Delta_0$ is much smaller $|c_0|$, the topological region is approximated as $|c_0|<\mu$. In one or more embodiments, the system can be topological as long as the chemical potential $\mu$ cuts through the edge states.

FIGS. 2A-2E are discussed individually below, and provide additional examples of the operation of one or more embodiments. For purposes of brevity, description of like elements and/or processes employed in other embodiments is omitted. In accordance with one or more embodiments, FIG. 2A depicts a schematic plot of QAHI 220/SC 210 geometry, e.g., similar to the embodiments discussed with FIG. 1 above. As shown, a cut 230 is made in QAHI 220 in y-direction 240 of a distance (d) 225. X-direction 250 is also shown as perpendicular to y-direction 240. Edge states 265A-B are shown as being of a distance (d) 225 apart.

FIG. 2B is a chart of an example energy spectrum for QAHI 220 with energy in millielectronvolts, E(meV) 260 being in the y-axis and the momentum of the y-direction $k_y$ being in the x-axis. In chart 250, the edge states 252 near the cut 230 are shown, along with chemical potential 255. Although not shown, a periodic boundary condition in the y-direction can be imposed so that $k_y$ is a good quantum number. In this example, FIG. 2B shows the energy spectrum of a QAHI 220 with the geometry depicted in FIG. 2A. As would be expected by one having skill in the relevant art(s), given the description herein, there are chiral edge modes 265A-B inside the bulk gap of QAHI 220.

FIG. 2C is an example chart of measurements from an implantation where chemical potential is inside the bulk gap in the QAHI and superconductivity is induced, in accordance with one or more embodiments. For purposes of brevity, description of like elements and/or processes employed in other embodiments is omitted.

As would be evident to one having skill in the relevant art(s), given the description herein, the left panel of FIG. 2C depicts an example where, when the chemical potential 255 is inside the bulk gap and superconductivity is induced, edge states 230 can be gapped out. Further, the right panel of FIG. 2C depicts an example of BdG energy spectrum 235 when the superconducting pairing can be introduced onto the edge states. FIGS. 2D-E show the energy E 240 and 250, respectively (in unit of $\Delta$) as a function of $k_y$ for a sample with an example 160 lattice sites in the x-direction 250. In the example of charted measurements in FIG. 2D, the width of the cut 230 (e.g., d 225) is 30 sites, while in 2E, width (d 225) of the cut 230 is 4 sites. In non-limiting examples of FIGS. 2B, 2D, and 2E, the magnetization energy $M_z$=10 meV, the chemical potential $\mu$=3 meV and the pairing potential $\Delta$=1 meV.

Additional technical details for the plots of FIG. 2B, 2D, 2E are provided below. One or more embodiments can construct a tight-binding model for a QAHI 120/SC 110 heterostructure with a cut (e.g., removed region 160) and the geometry as illustrated in FIG. 1. As shown previously, QAHI 120 state can be realized by a thin film of magnetic doped topological insulator when the magnetic gap induced by the magnetic dopen is larger than the hybridization gap of the two Dirac surface states of the topological insulator. Therefore, in an example QAHI 120 Hamiltonian can be written as:

$$H_{QAHI}=\Sigma_k \Phi_k^\dagger (v_F k_y \sigma_x \tau_z - v_F k_x \sigma_y \tau_z + m(k)\tau_x + M_z \sigma_z)\Phi_k. \quad \text{(Equation \#3)}$$

Here, $\Phi_k^\dagger=(\phi_{tk\uparrow}^\dagger,\phi_{tk\downarrow}^\dagger,\phi_{bk\uparrow}^\dagger,\phi_{bk\downarrow}^\dagger)$ is a four-component electron creation operator with momentum k, where the subscripts t (b) and $\uparrow$ ($\downarrow$) denotes the top (bottom) layer and spin up (down) index respectively, $\sigma$ and $\tau$ are the Pauli matrices for spin and layer subspaces, $v_F$ denotes the Fermi velocity of topological insulator surface states, $m(k)=m_0+m_1(k_x^2+k_y^2)$ describes the hybridization between top and bottom surface states, and $M_z$ is the magnetization energy induced by the magnetic doping and external magnetic field.

In the calculation, one or more embodiments can set $v_F$=3 eV·Å, $m_0$=−5 meV, $m_1$=15 eV·Å$^2$. The system is in QAHI 120 phase when the magnetization energy $M_z$ exceeds the hybridization energy $m_0$, where Chern number $\mathcal{C}$=1 for $M_z>|m_0|$ and $\mathcal{C}$=−1 for $M_z<-|m_0|$. In this phase, the system supports $|\mathcal{C}|$ chiral edge states. In a tight-binding Hamiltonian example for this QAHI 120, a strip of QAHI 120 with periodic condition in the y-direction and 160-sites in the x-direction as shown in FIG. 2A can be used. Importantly, a cut along the y-direction can be made in the middle of QAHI 220 to create a pair of counter propagating chiral edge modes 165A-B. To eliminate the complication of the edge states on the outer sides of the sample, one or more embodiments can utilize closed boundary condition on the left and right edges. In one or more embodiments, when the chemical potential is inside the bulk gap and superconductivity is induced, the edge states can be gapped out as schematically shown in FIG. 2C.

An embodiment that uses a tight-binding model can couple the top layer of QAHI 220 to an extra layer of superconductor. The superconductor induces pairing as well as hybridization between the two edge modes. The energy spectrum of the depicted heterostructure with different edge state separations (denoted by d 225) are shown in FIGS. 2D and 2E. In some circumstances, when d is wider than the superconducting coherence length $\eta\approx v_F/\Delta_0$ of the superconductor, which is estimated to be about 10 sites in the tight-binding model, the induced pairing gap of the system can be small. However, when d is comparable with η, the induced pairing gap can be sizable. When a conventional s-wave pairing is induced on the two counter-propagating edge modes, the system can become a topological superconductor.

Thus, as discussed with FIGS. 1 and 2A-E above, in one or more embodiments, MZMs can be supported in a QAHI/SC heterostructure with a cut to QAHI 220. To display the wavefunction of MZMs in the real-space an example tight-binding model having 2500 sites in the y-direction and 160 sites in the x-direction is constructed to describe QAHI 220/SC 210 heterostructure, in which a cut of 2000 sites long and 4 sites wide can be made on QAHI 220 layer as depicted in FIG. 1. At least due to the bulk topological property, the chiral edge mode can circumvent the vacuum region and propagate along the cut. This creates a pair of counter-propagating chiral modes locally on the two edges of the cut. When QAHI 220 is covered by superconductor 210, the superconductor can mediate coupling, as well as induce superconducting pairing on the chiral edge modes along the cut. In accordance with one or more embodiments, this can result in a localized Majorana mode at the end of the cut as depicted in FIG. 3A, discussed below.

It is important to note that, for the calculation with the tight-binding model, in order to eliminate the effect of the chiral edge modes which circulate at the boundary of QAHI 220, one or more embodiments can introduce periodic boundary conditions along both x and y directions such that the edge states appear along the vacuum strip only. In the realistic geometry of FIG. 1, there are gapless edge modes entering and leaving the vacuum strip region. Therefore, in one or more embodiments, Majorana mode $\gamma_2$ can be delocalized and the wavefunction will merge with the wavefunction of the gapless chiral edge modes. Alternatively, Majorana mode $\gamma_1$ 150B can remain localized, with this being detected by scanning tunneling microscopy (STM) measurements discussed with FIGS. 3A-3B below, in accordance with one or more embodiments.

Figure 3A:
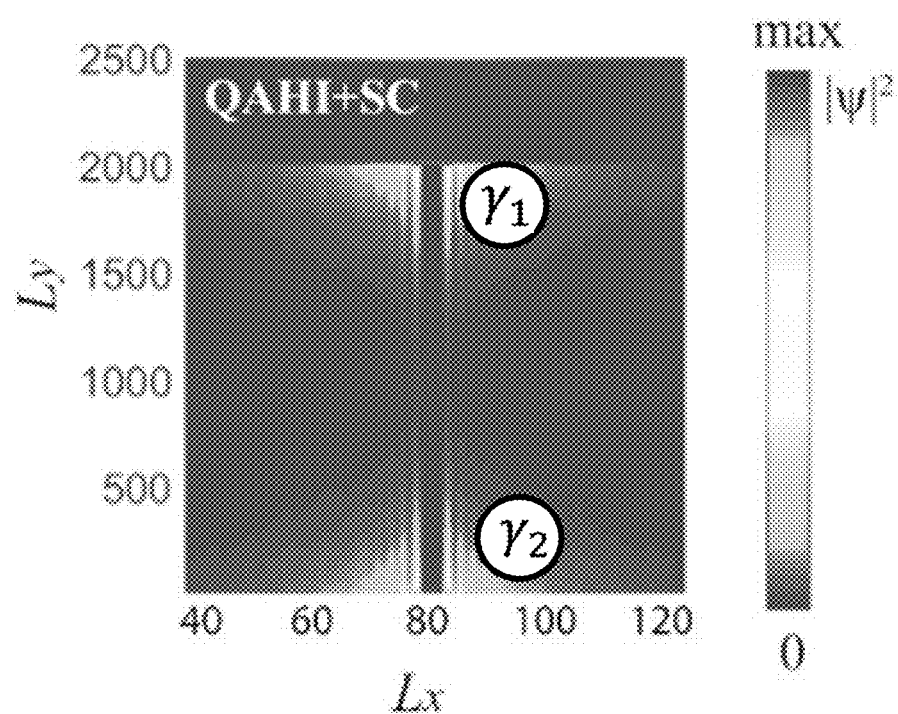
FIG. 3A shows a chart of an example localized wavefunction of an example geometry for generating Majorana zero-energy modes, in accordance with one or more embodiments.
Figure 3B:
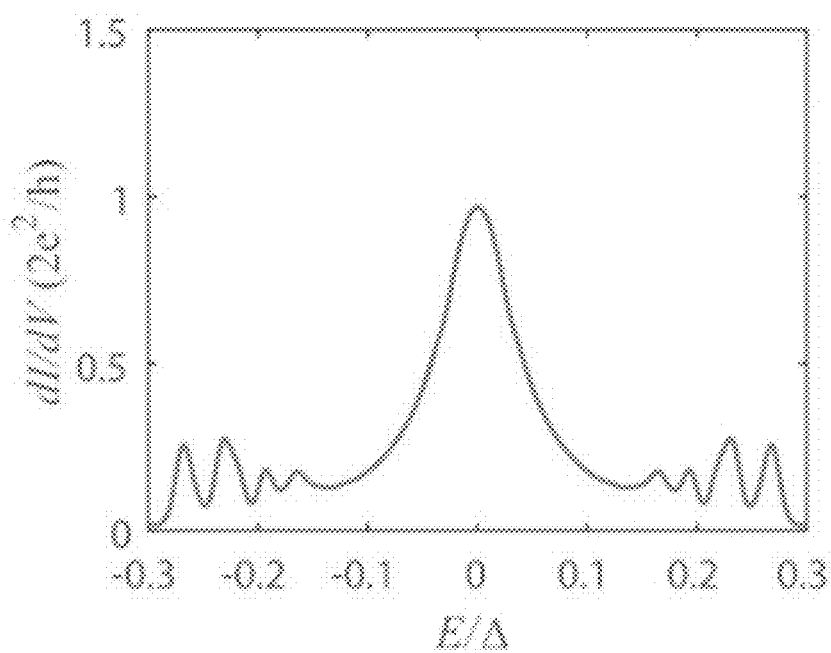
FIG. 3B shows a chart of data associated with tunneling experiments that can be conducted to detect generated Majorana zero-energy modes, in accordance with one or more embodiments.

FIGS. 3A-3B reference an additional geometry for generating MZMs, and provide additional examples of the operation of one or more embodiments. For purposes of brevity, description of like elements and/or processes employed in other embodiments is omitted.

FIG. 3A shows a chart of an example localized wavefunction at the end of a cut in example QAHI/SC geometry with 2500 sites×160 sites and a cut of 2000 sites×4 sites is created in the middle with one end touching the edge. FIG. 3B shows a chart of data associated with STM tunneling experiments that can be conducted to detect generated MZMs, in accordance with one or more embodiments. For purposes of brevity, description of like elements and/or processes employed in other embodiments is omitted. One having skill in the relevant art(s), given the description herein, appreciates that this is a non-limiting example, with other dimensions, numbers of sites, numbers of cuts, and placements of cuts also operating in accordance with one or more of the descriptions provided herein.

Returning to FIG. 1, in an example implementation, a selected geometry can be used to generate MZMs 150A-B, and detect generated MZMs. As discussed above, as shown in FIG. 1, a cut was made perpendicularly (e.g., removed region 160) on the one edge of sample QAHI 120 and the superconductor 110 covers the vacuum region of the cut (e.g., the space within removed region 160) to create MZMs 150A-B. As depicted in FIG. 1, a macroscopic lead can be attached to opposite edge of the QAHI 120 (e.g., electrode 140A), and superconductor 110 can be grounded by a second lead, e.g., electrode 140B, e.g., to ground 170B. In this example, an incoming electron mode from electrode 140A can come into QAHI 120 and can be reflected to a hole mode by an MZM, which can give rise to a resonant Andreev reflection. In some implementations, the tunneling differential conductance of the system can be simulated with recursive function methods, e.g., Green's recursive function methods. In additional embodiments, the differential conductance can be a function of voltage difference between the electrode 140A and electrode 140B.

FIG. 3B depicts an example of differential conductance as a function of voltage difference between the electrode 140A and electrode 140B, in the example grounded superconductor 110. This example shows a quantized zero bias peak with value $2e^2/h$ which can be a value associated with the presence of MZMs 150A and 150B. In additional embodiments, localized MZM (e.g., MZM 150B) can also be detected by scanning tunneling spectroscopy experiments.

Stated differently, FIG. 3B shows a chart of simulated tunneling spectra for the QAHI/SC geometry shown in FIG. 1. In this example, a quantized $2e^2/h$ conductance can be induced by one or both of MZMs 150A-B. In this example, the magnetization energy $M_z$=10 meV, the chemical potential $\mu$=3 meV, and the temperature T=0.05 K are used for this non-limiting illustration.

Figure 4:
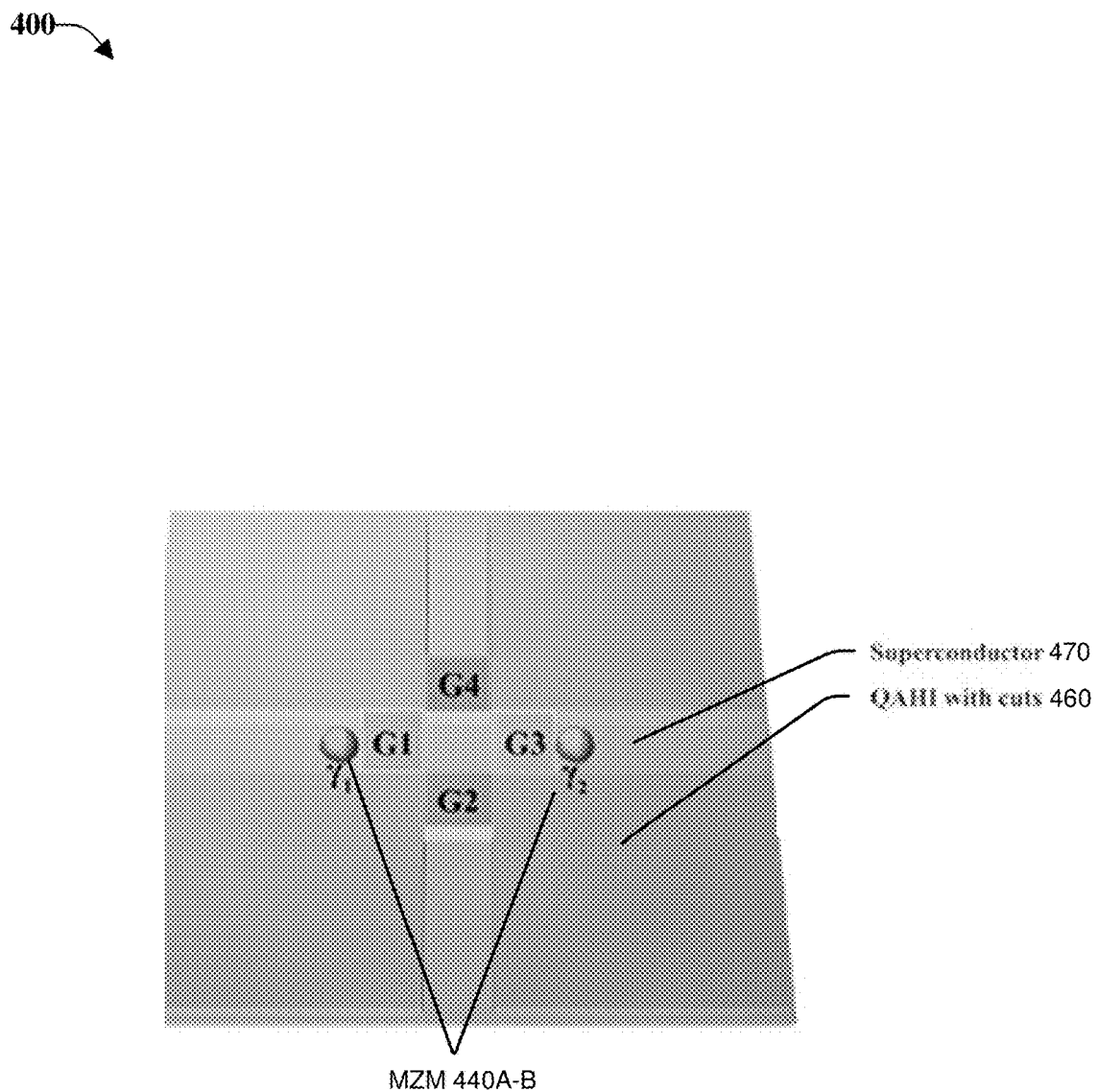
FIG. 4 and FIG. 5 depict an example insulator/superconductor heterostructure, in accordance with one or more embodiments.
Figure 5:
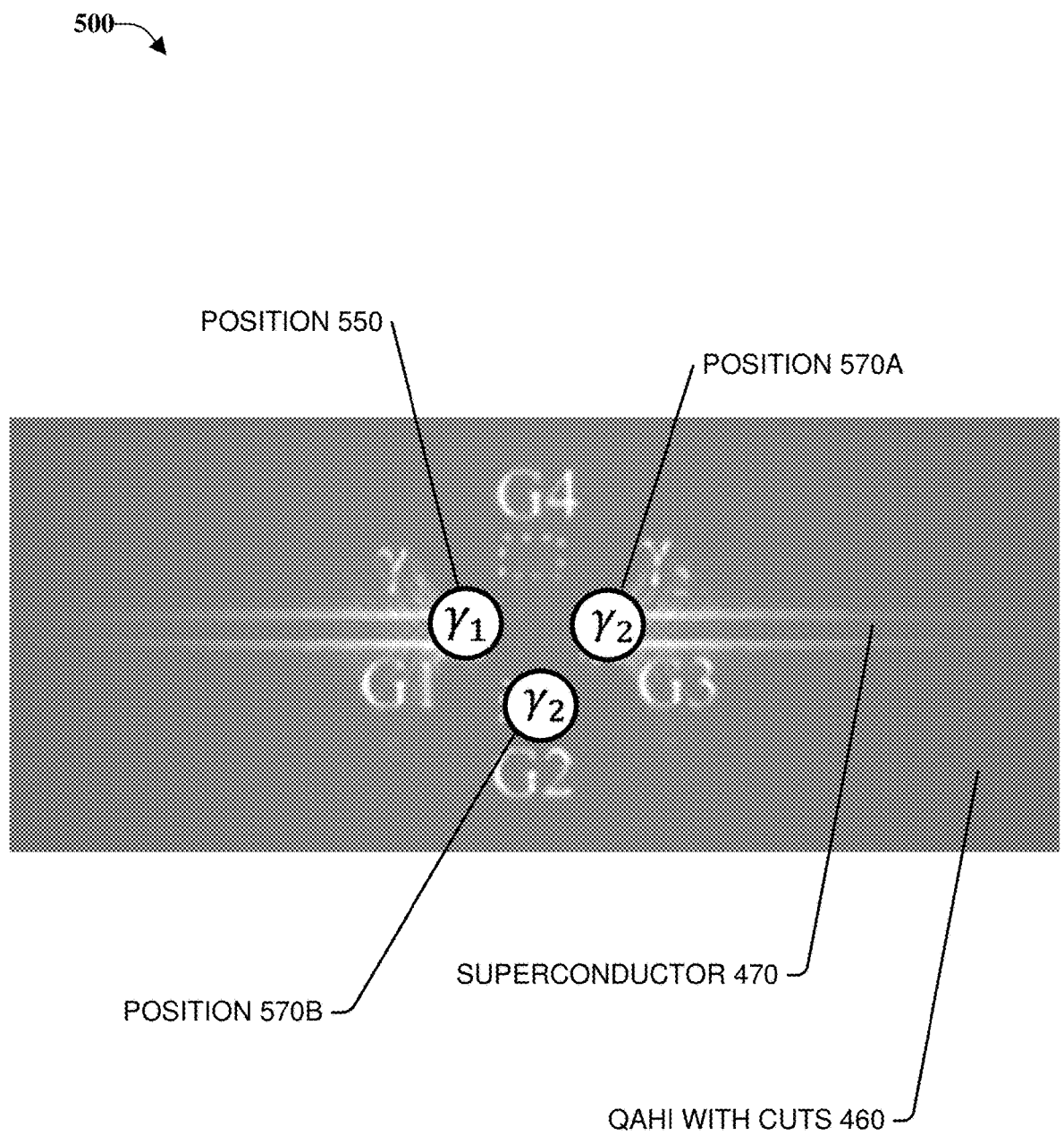

FIGS. 4-5 depict an example QAHI/SC heterostructure 400, in accordance with one or more embodiments. For purposes of brevity, description of like elements and/or processes employed in other embodiments is omitted. It should be noted that, in some examples discussed with FIGS. 4-5 below, gates G1-G4 can be simulated by a semiconductor with a hopping parameter $t_{gate}=v_F$ and a gap size $m_{gate}$=20 meV. Also, in the calculation of these subfigures for the simulation, to make the MZMs more localized, a smaller $v_F$ (e.g., one third of the original $v_F$ noted above) can be used. In addition, to facilitate the simulation, the sample size used can be 500-by-500 lattice sites, and periodic boundary conditions on both x- and y-directions can be adopted.

FIG. 4 depicts a cross-shape cut on a QAHI/SC heterostructure 400 (e.g., cuts through QAHI 460 revealing superconductor 470). Gates G1-G4 are depicted at areas within the cuts and MZMs 440A-B depicted as generated at gates G1 and G3, respectively. As discussed further below, one or more combinations of gates G1-G4 can be made from semiconducting materials, and the gates can be open or closed. This combination of elements depicted in FIG. 4 and other figures of this disclosure can facilitate the performance of braiding operations of MZMs 440A-B, e.g., the example cross-shape cut on a QAHI/SC heterostructure 400 and combinations of open and closed gates G1-G4 can facilitate braiding operations.

Figure 6:
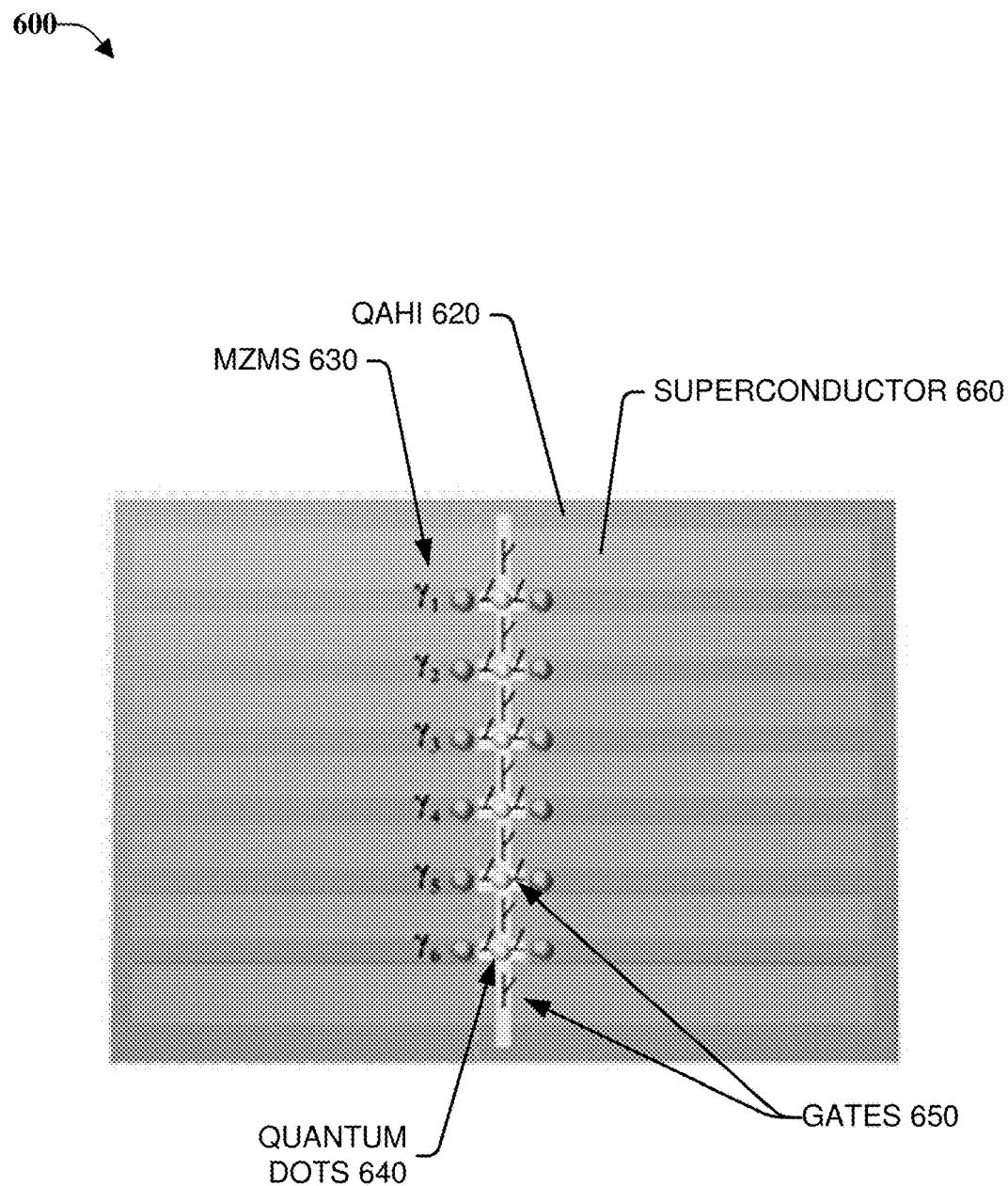
FIG. 6 shows a schematic picture of a hexon architecture for generating and manipulating Majorana zero-energy modes to facilitate topological quantum computation, in accordance with one or more embodiments.

It should be appreciated that, one or more of the features described or suggested by the embodiments discussed herein can be used, in some circumstances, to facilitate scalable topological quantum computation. After a discussion of the generation of MZMs above, FIGS. 5-6 are used to discuss different example ways that one or more embodiments can manipulate the generated MZMs, e.g., complicated qubits generated based on the presence of multiple MZMs can enable topological quantum computation.

One having skill in the relevant art(s), given the description herein, appreciates that, in some circumstances, junctions with complicated geometries in conventional approaches can be replaced by cuts on QAHI/SC heterostructure 400, e.g., as depicted in FIGS. 4-5. In an implementation, the area under gates G1-G4 can be made from semiconducting materials such that, by tuning the chemical potential, the semiconducting material can be conducting or insulating, e.g., closed or open, respectively. With this structure, when ones of gates G1-G4 are open, the area under the respective open gate is insulating, and when ones of gates G1-G4 are closed, the area under the respective open gate is conducting, e.g., because the area under gates G1-G4 can be metallic, and can thus mediate coupling between the two edge modes 165A-B, discussed above with FIGS. 1-3.

In examples of this manipulation of gates G1-G4, FIG. 5 depicts example waveforms and gates that can facilitate measurement-based topological quantum computation, in accordance with one or more embodiments. FIG. 5 depicts superconductor 470 and QAHI with cuts 460, along with gates G1-G4 and MZMs $\gamma_1$ and $\gamma_2$. As discussed below, while MZM $\gamma_1$ can be created in position 550, MZM $\gamma_2$ can be created in one or more of positions 570A-B depending upon combinations of the open or closed condition of gates G2 and G3.

In a first example, FIG. 5 depicts example waveforms $|\psi|^2$ for MZMs $\gamma_1$ and $\gamma_2$. In this example, gates G1 and G3 are closed and the remaining gates G2 and G4 remain open. In one or more embodiments, gates G1 and G3 can be closed so that the two chiral edge modes can hybridize strongly near the closed gates. In one or more embodiments, strong hybridization can create a topologically trivial region near the two gates, and as a result of the topologically trivial region, two localized MZMs $\gamma_1$ and $\gamma_2$ can be created near the center of the junction, e.g., at positions 550 and 570A, respectively.

In a second example that can be depicted with FIG. 5, when both gates G1 and G2 are closed and gates G3 and G4 are open, the creation of MZM $\gamma_2$ can be moved from one arm of the cross cut to another arm, e.g., from position 570A to position 570B. In this example, creation of MZM $\gamma_1$ can remain with closed gate G1. Based at least on the foregoing description and the entire description herein, one having skill in the relevant art(s), appreciate that for both of these examples, one or more embodiments can use opening and closing of gates G1-G4 to facilitate non-Abelian braiding of MZMs $\gamma_1$ and $\gamma_2$.

FIG. 6 shows a schematic picture of a hexon architecture 600 based on a QAHI/SC heterostructure that can facilitate topological quantum computation, in accordance with one or more embodiments. For purposes of brevity, description of like elements and/or processes employed in other embodiments is omitted. FIG. 6 depicts QAHI 620 cut to reveal superconductor 660, with gates 650 controlling the creation of MZMs 630 adjacent to closed ones of gates 650, and quantum dots 640.

In one or more embodiments, for quantum computation, the braiding of MZMs can be replaced with a parity measurement of MZMs 630, thereby facilitating measurement-based topological quantum computation. In an example implementation, one or more embodiments can use architectures such as hexon architecture 600 and tetron architecture (not shown) to achieve the measurement-based topological quantum computation. In this example, the architecture of FIG. 6 can replace the some or all of the functions of an approach that uses semiconducting nanowires with MZMs.

As shown, hexon architecture 600 shows a so-called one-sided hexon, built on the QAHI/SC structures described with FIGS. 1, 2, 4, and 5 above. In this example, six of MZMs 630 ($\gamma_n$ where n goes from 1 to 6) of the hexon are localized at the ends of the cuts of QAHI 620. It is important to note that the MZMs located in the middle of the QAHI are separated from the low energy modes residing on the circumference of QAHI 620 by fully gapped QAHI regions or fully gapped superconducting regions, so that the gapless edge modes will not affect the fermion parity of the hexon formed by the six localized MZMs 630. In a variation of this example, the full set of the single-qubit gates (e.g., Clifford gates) can be generated by sequential measurements of fermion parities of pairs of MZMs 630, as shown in FIG. 6.

Figure 8:
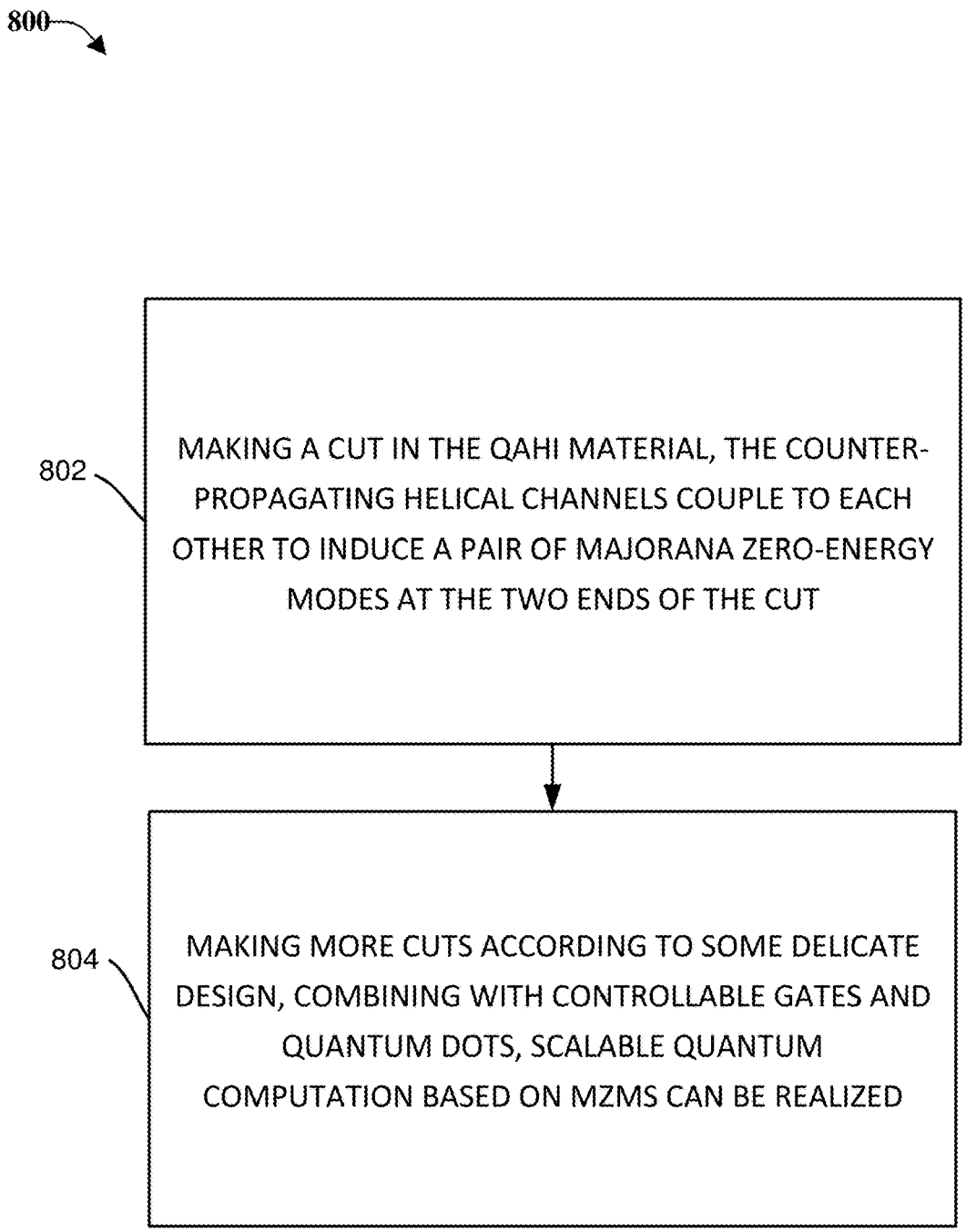

FIGS. 7 and 8 together form a method 700-800 that can facilitate topological quantum computation. At 702, the method can include combining a superconducting material with a quantum anomalous Hall insulator (QAHI) material, so that through proximity effects, superconductivity can be induced onto the QAHI. At 704, the method can further include making a cut of a width comparable to the coherence length of the superconductor, wherein the topologically protected helical channels on the edges of the cut can couple to each other through the superconductor. Further, at 802, the method can include making a cut in the QAHI material such that the counter-propagating helical channels couple to each other to induce a pair of Majorana zero-energy modes at the two ends of the cut. At 804, the method can include making more cuts according to some delicate design and combining with controllable gates and quantum dots to facilitate scalable quantum computation based on MZMs.

What is claimed is:

1. A system, comprising:
a superconductor comprised of a superconducting material; and
an insulator that covers the superconductor, wherein the insulator comprises a cut, and wherein, based on the cut, a zero-energy quasiparticle is able to be created, wherein a width of the cut was selected based on an estimated coherence length of the superconductor.

2. The system of claim 1, wherein the insulator comprises a quantum anomalous Hall insulator.

3. The system of claim 1, wherein the cut comprises a cut with a helical channel.

4. The system of claim 3, wherein the helical channel comprises a helical channel with counter-propagating electron modes.

5. The system of claim 4, wherein the counter-propagating electron modes comprise chiral edge modes.

6. The system of claim 3, wherein the helical channel is topologically protected.

7. The system of claim 1, wherein the zero-energy quasiparticle is able to be created at two ends of the cut.

8. The system of claim 1, further comprising, creating the zero-energy quasiparticle.

9. The system of claim 8, wherein the zero-energy quasiparticle comprises a Majorana quasiparticle.

10. The system of claim 1, wherein the Majorana quasiparticle comprises a pair of Majorana zero-energy modes.

11. A method, comprising: combining a superconductor material with an insulator material; creating a vacuum strip in the insulator material; and based on the vacuum strip, creating, a topologically protected helical channel with counter-propagating electron modes, wherein a physical dimension of the vacuum strip is based on a physical dimension of the superconductor material.

12. The method of claim 11, further comprising, by inducing superconductivity on the topologically protected helical channel, generating a pair of Majorana zero-energy modes at opposite ends of the cut.

13. The method of claim 11, further comprising:
inducing superconducting pairings on the helical channel, resulting in induced pairings; and
based on the induced pairings, inducing superconductivity on the helical channel.

14. The method of claim 11, wherein the physical dimension of the superconductor material comprises a coherence length of the superconductor material.

15. The method of claim 11, wherein the insulator material comprises a quantum anomalous Hall insulator material.

16. The method of claim 11, wherein the physical dimension of the vacuum strip comprises a width of the vacuum strip.

17. A device, comprising: a material that induces superconductivity; and an insulator combined with the material, wherein the insulator comprises a removed region, and wherein, based on the removed region, a topologically protected helical channel with counter-propagating electron modes is created.

18. The device of claim 17, wherein the material induces superconductivity on the topologically protected helical channel, and wherein the inducing of superconductivity generates a pair of Majorana zero-energy modes at two ends of the removed region.

19. The device of claim 17, wherein a width of the removed region is based on a length of a region over which superconductivity is able to be induced by the material.

20. The device of claim 17, wherein the insulator comprises a two-dimensional material.

* * * * *